United States Patent [19]
Nasserbakht

[11] Patent Number: 5,864,168
[45] Date of Patent: *Jan. 26, 1999

[54] APPARATUS AND METHOD FOR REDUCED SUBSTRATE NOISE COUPLING

[75] Inventor: Gitty N. Nasserbakht, Dallas, Tex.

[73] Assignee: Texas Instruments Incorporated, Dallas, Tex.

[*] Notice: This patent issued on a continued prosecution application filed under 37 CFR 1.53(d), and is subject to the twenty year patent term provisions of 35 U.S.C. 154(a)(2).

[21] Appl. No.: 802,801

[22] Filed: Feb. 18, 1997

[51] Int. Cl.$^6$ ..................................................... H01L 29/00
[52] U.S. Cl. ........................................... 257/500; 257/522
[58] Field of Search ................................... 257/500, 506, 257/522, 622

[56] References Cited

U.S. PATENT DOCUMENTS

| | | | |
|---|---|---|---|
| 3,787,710 | 1/1974 | Cunningham | 257/506 |
| 4,847,672 | 7/1989 | Polhemus | 257/503 |
| 5,453,713 | 9/1995 | Partovi et al. | 257/552 |
| 5,481,128 | 1/1996 | De Jong et al. | 257/360 |
| 5,514,901 | 5/1996 | Peppiette et al. | 257/557 |
| 5,595,607 | 1/1997 | Wenham et al. | 136/256 |
| 5,705,425 | 1/1998 | Miura et al. | 438/421 |

*Primary Examiner*—Mark V. Prenty
*Attorney, Agent, or Firm*—Jacqueline J. Garner; W. James Brady III; Richard L. Donaldson

[57] ABSTRACT

For mixed signal and RF integrated circuits, the problem of substrate coupled noise can be resolved by using a moat (12) formed in the common substrate to substantially surround sensitive circuits (16). Signal bridges (18, 19) may be formed to provide a path for signals to and from the sensitive circuits (16).

8 Claims, 1 Drawing Sheet

APPARATUS AND METHOD FOR REDUCED SUBSTRATE NOISE COUPLING

TECHNICAL FIELD OF THE INVENTION

This invention is related in general to the field of semiconductor devices and processes. More particularly, the invention is related to apparatus and method for reducing substrate noise coupling in mixed signal integrated circuits.

BACKGROUND OF THE INVENTION

In integrated circuits (ICs), noise generated in one part of the chip by one circuit may couple into circuits in other parts of the chip by propagating through the common substrate. In mixed signal integrated circuits where sensitive analog circuits operating in micro-volt range reside on the same substrate as high speed digital circuits switching between zero and $V_{DD}$, the substrate coupled noise can adversely disrupt the performance of the analog circuits.

Mixed signal ICs that are plagued by this problem include data converters, hard disk drive products, and integrated DSP and baseband chips. Because the noise is capacitively coupled, this problem becomes even more severe at high frequencies, such as in radio frequency (RF) circuits used in cellular phones, wireless local area networks (LANs), personal communication service (PCS) products, and remote control RF products.

The problem of substrate coupled noise currently has no good solution. The integrated circuit engineers and manufacturers are forced to put analog circuits and digital circuits in separate integrated circuits or use extreme care to separate analog and digital circuit blocks and use multiple guard rings around the sensitive circuits. A guard ring is typically a p+ (or n+) diffusion or an n-well (or p-well) structure which circle the sensitive circuit. The p+ diffusion guard ring is not very effective in insulating the sensitive circuits from substrate coupled noise due to the inductance of the bond wire connecting the guard ring to ground. The bond wire has some resistance at high frequencies, which inhibits a total collection and evacuation of the noise carriers. The n-well guard ring is also not very effective because it does not collect the noise carriers but merely diverts them a little deeper into the substrate, where they may still adversely affect the sensitive circuits. Without a viable solution, substrate coupled noise currently limits the performance of high speed, high accuracy mixed signal ICs. Further, highly integrated RF chip implementation is not possible without substantially reducing the substrate noise coupling.

SUMMARY OF THE INVENTION

Accordingly, there is a need for apparatus and a method for reducing the substrate noise coupling in integrated chips.

In accordance with the present invention, apparatus and method for reducing substrate coupled noise are provided which eliminates or substantially reduces the disadvantages associated with prior apparatus and methods.

In one aspect of the invention, an integrated circuit comprises a first circuit, a second circuit, and a moat formed in a common substrate of the first and second circuits for substantially surrounding the first circuit.

In another aspect of the invention, a method for reducing substrate coupled noise includes the steps of forming first circuits with tendency to generate the substrate coupled noise and second circuits sensitive thereto, and forming a moat substantially encircling the second circuits.

In yet another aspect of the invention, apparatus for isolating sensitive circuits from substrate coupled noise is to use a moat substantially surrounding the sensitive circuit.

BRIEF DESCRIPTION OF THE DRAWINGS

For a better understanding of the present invention, reference may be made to the accompanying drawings, in which.

DETAILED DESCRIPTION OF THE INVENTION

Figure 1:
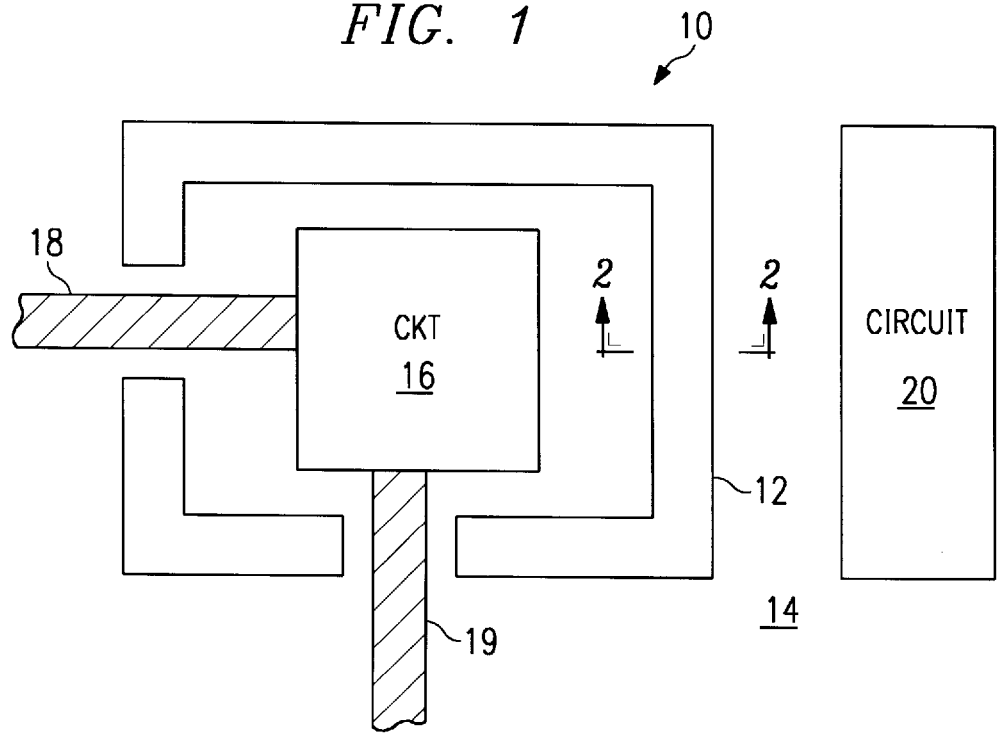
FIG. 1 is a top view of a portion of a mixed signal integrated circuit constructed according to the teachings of the present invention.
Figure 2:
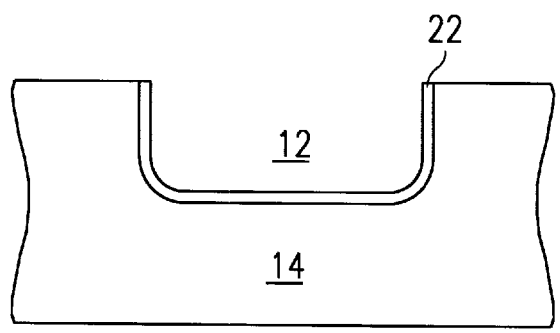
FIG. 2 is a cross-sectional view of a moat created in the substrate constructed according to the teachings of the present invention.

The preferred embodiment(s) of the present invention is (are) illustrated in FIGS. 1 and 2, like reference numerals being used to refer to like and corresponding parts of the various drawings.

Referring to FIG. 1, a portion of an integrated circuit, indicated generally at 10, is shown with a moat 12 formed in the substrate 14 substantially surrounding a circuit 16. One or more signal bridges 18 and 19 form paths for incoming or outgoing signals to connect between circuits 16 and 20. As shown in FIG. 1, moat 12 does not extend under signal bridges 18 and 19. These input/output signals may be carried on metal lines crossing signal bridges 18 and 19. Accordingly, circuit 16 is substantially isolated from circuit 20, which is located on common substrate 14 but outside of the enclosure made by moat 12.

In operation, circuit 16 may be an analog circuit which is sensitive to substrate coupled noise generated by circuit 20, for example, where circuit 20 is a digital circuit switching between zero and five or three volts. Alternatively, moat 12 may be used to encircle and isolate a noise generating circuit from the rest of the integrated circuit.

It may be seen in FIG. 2, that moat 12 is a gap of a predetermined width and depth formed in substrate 14. Optionally, a very thin layer of oxide 22 may be deposited on the surface of moat 12 to eliminate exposed silicon. The width of moat 12 should be sufficient so that noise carriers cannot capacitively couple through the air gap in moat 12. For most applications, the width of moat 12 may range in the tens of microns. Further, the deeper the moat, the higher the resistivity in the substrate path between the noise source and the sensitive circuit(s). Accordingly, the desired depth of moat 12 need not be more than 10–15 microns for most applications.

Moat 12 may be formed by scribing, wet or dry etching, or any other method of creating an air gap of predetermined depth and width in the surface of the substrate. When etching is used, only one additional mask level is needed. Additionally, the scribing or etching step may be performed as a low cost back-end process, because the formation of moat 12 does not need to be a very precise process.

The area penalty in using moat 12 is small. If only a small number of sensitive circuits are encircled by moat 12, the real estate required for moat 12 is insignificant. On the contrary, when moat 12 is used to isolate sensitive circuits, the number of input/output pins dedicated to substrate ground can be reduced, which may result in net area savings.

It may be understood that moat 12 may take on any pattern or shape as long as it substantially surrounds the circuit in question, be it analog or digital circuits. Further, there is no limitation on the cross-sectional area or shape of moat 12, as long as the desired width and depth are present. It is further contemplated by the teachings of the present invention that insulative materials may be deposited in moat 12 to achieve the same function in the same manner.

Although the present invention and its advantages have been described in detail, it should be understood that various changes, substitutions and alterations can be made therein without departing from the spirit and scope of the invention as defined by the appended claims.

What is claimed is:

1. An integrated circuit, comprising:

a first circuit;

a second circuit;

a recess formed in a common substrate of said first and second circuits and substantially surrounding said first circuit, said recess having a width in the range of tens of microns and a depth on the order of 10–15 microns; and at least one signal bridge crossing for coupling said first and second circuits, wherein said recess substantially surrounds said first circuit except for an area under said at least one signal bridge.

2. The integrated circuit, as set forth in claim 1, wherein said recess comprises an air gap in said common substrate.

3. The integrated circuit, as set forth in claim 1, wherein said first circuit is an analog circuit and said second circuit is a digital circuit.

4. The integrated circuit, as set forth in claim 1, wherein said second circuit is an analog circuit and said first circuit is a digital circuit.

5. The integrated circuit, as set forth in claim 1, wherein said first circuit is a circuit sensitive to substrate coupled noise generated by said second circuit.

6. The integrated circuit, as set forth in claim 1, wherein said second circuit is a circuit sensitive to substrate coupled noise generated by said first circuit.

7. The integrated circuit, as set forth in claim 1, wherein said recess comprises a thin layer of oxide formed on its surface.

8. Apparatus for shielding sensitive circuit from substrate coupled noise, comprising:

a recess substantially surrounding said sensitive circuit; and at least one signal bridge for providing a path for input and output signals to and from said sensitive circuit, wherein said recess does not extend under said at least one signal bridge.

* * * * *